United States Patent
Wu

(10) Patent No.: US 11,295,802 B2
(45) Date of Patent: Apr. 5, 2022

(54) CIRCUIT HAVING A PLURALITY OF RECEIVERS USING THE SAME REFERENCE VOLTAGE

(71) Applicant: MEDIATEK INC., Hsin-Chu (TW)

(72) Inventor: Chung-Hwa Wu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/900,981

(22) Filed: Jun. 14, 2020

(65) Prior Publication Data

US 2020/0411074 A1 Dec. 31, 2020

Related U.S. Application Data

(60) Provisional application No. 62/868,022, filed on Jun. 28, 2019.

(51) Int. Cl.
*H03F 1/26* (2006.01)
*G11C 11/4074* (2006.01)
(Continued)

(52) U.S. Cl.
CPC ........... *G11C 11/4074* (2013.01); *G05F 3/20* (2013.01); *H03F 1/26* (2013.01); *H03F 3/45269* (2013.01); *H03F 2203/45512* (2013.01)

(58) Field of Classification Search
CPC ... G11C 11/4074; G05F 3/20; H03F 3/45269; H03F 1/26; H03F 2203/45134;
(Continued)

(56) References Cited

U.S. PATENT DOCUMENTS

| 6,344,767 | B1* | 2/2002 | Cheung ............... G11C 27/026 327/336 |
| 2007/0085601 | A1 | 4/2007 | Idei |
| 2008/0024222 | A1 | 1/2008 | Moane |

FOREIGN PATENT DOCUMENTS

| CN | 101674049 A | 3/2010 |
| CN | 105610455 A | 5/2016 |

(Continued)

OTHER PUBLICATIONS

A. C. Metting Van Rijn et al., High-quality recording of bioelectric events Part 2 Low-noise, low-power multichannel amplifier design, 2200 Medical & Biological Engineering & Computing, 29(Jul. 1991), No. 4, Stevenage, Herts., GB, pp. 433-439, XP000208756, Jul. 1991.

(Continued)

*Primary Examiner* — Jung Kim
(74) *Attorney, Agent, or Firm* — Winston Hsu

(57) ABSTRACT

The present invention provides a circuit including a reference voltage generator and a plurality of receivers, wherein the reference voltage generator is configured to generate a reference voltage, and each of the receivers is configured to receive the reference voltage and a corresponding input signal to generate a corresponding output signal. In addition, for at least a specific receiver of the plurality of receivers, the specific receiver comprises at least one amplifying stage, the amplifying stage comprises a first input terminal configured to receive the corresponding input signal, a second input terminal configured to receive the reference voltage, a first output terminal configured to generate a first signal, and a second output terminal configured to generate a second signal; and the specific receiver further comprises a first feedback circuit coupled between the first output terminal and the second input terminal.

9 Claims, 3 Drawing Sheets

(51) Int. Cl.
*G05F 3/20* (2006.01)
*H03F 3/45* (2006.01)

(58) Field of Classification Search
CPC . H03F 2203/45586; H03F 2203/45332; H03F 2203/45512; H03F 3/45659; H03F 2203/45418; H03F 2203/45008; H03F 3/45183; H03F 3/68; H03F 3/45475; H03F 1/30; H03F 1/301; H03F 2203/45546; H04B 1/16
See application file for complete search history.

(56) References Cited

FOREIGN PATENT DOCUMENTS

| WO | 2007/080528 A1 | 7/2007 |
|----|----------------|--------|
| WO | 2009/046349 A1 | 4/2009 |

OTHER PUBLICATIONS

Hyung-Joon Chi et al., A 3.2Gb/s 8b Single-Ended Integrating DFE RX for 2-Drop DRAM Interface with Internal Reference Voltage and Digital Calibration, ISSCC 2008 / Session 5 / High-Speed Transceivers / 5.8, 2008 IEEE International Solid-State Circuits Conference, Feb. 4, 2008, USA, pp. 112-113 & 600, XP031390887.
A.C. Metting Van Rijn et al., "High-quality recording of bioelectric events part2 low-noise, low-power multichannel amplifier design", Medical & Biological Engineering & Computing, Jul. 1991, pp. 433-440, Jul. 1991.

* cited by examiner

US 11,295,802 B2

CIRCUIT HAVING A PLURALITY OF RECEIVERS USING THE SAME REFERENCE VOLTAGE

CROSS REFERENCE TO RELATED APPLICATIONS

This application claims the priority of U.S. Provisional Application No. 62/868,022, filed on Jun. 28, 2019, which is included herein by reference in its entirety.

BACKGROUND

In parallel bus applications such as dynamic random access memory (DRAM) or other high bandwidth memory device, a plurality of receivers within a front-end circuit of the memory device are configured to compare a received signal with a reference voltage to generate an output signal for use of the following circuits. However, because the reference voltage provided to the receivers is generated from a single reference voltage generator, a level of the reference voltage may be influenced by the received signals due to the parasitic capacitance between the received signals and the reference voltage, causing the reference voltage unstable. Particularly, if most of the receivers receive the signals having sample pattern, the reference voltage may be seriously influenced, and this unstable reference voltage may worsen the operations of the other receiver(s) receiving the signal with different pattern.

SUMMARY

It is therefore an objective of the present invention to provide a circuit having a plurality of receivers with feedback circuits capable of eliminating noise coupled to the reference voltage, to solve the above-mentioned problems.

According to one embodiment of the present invention, a circuit comprising a reference voltage generator and a plurality of receivers are disclosed, wherein the reference voltage generator is configured to generate a reference voltage, and each of the receivers is configured to receive the reference voltage and a corresponding input signal to generate a corresponding output signal. In addition, for at least a specific receiver of the plurality of receivers, the specific receiver comprises at least one amplifying stage, the amplifying stage comprises a first input terminal configured to receive the corresponding input signal, a second input terminal configured to receive the reference voltage, a first output terminal configured to generate a first signal, and a second output terminal configured to generate a second signal; and the specific receiver further comprises a first feedback circuit coupled between the first output terminal and the second input terminal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
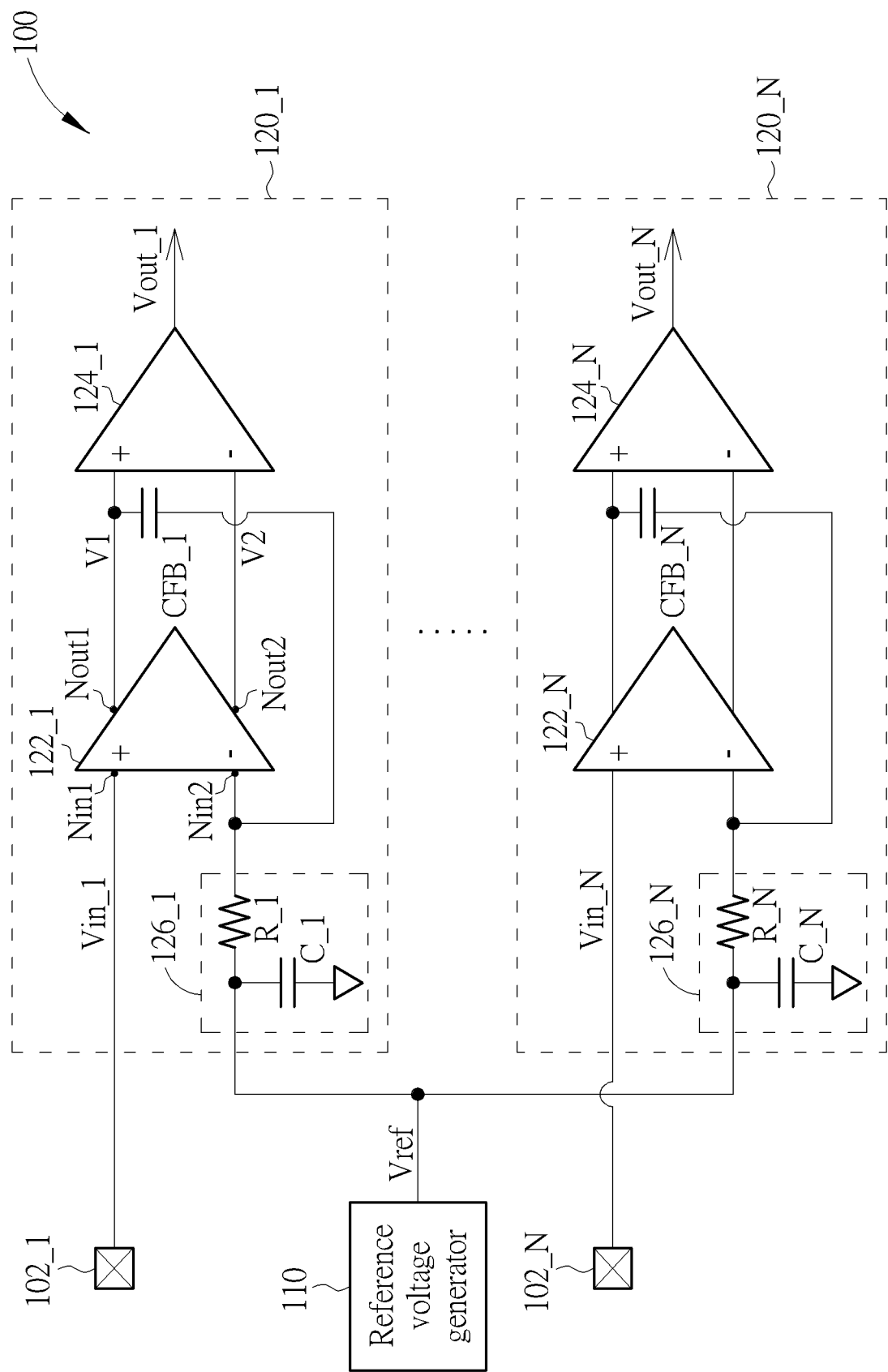
FIG. 1 is a diagram illustrating a circuit according to one embodiment of the present invention.

FIG. 1 is a diagram illustrating a circuit 100 according to one embodiment of the present invention. As shown in FIG. 1, the circuit 100 comprises a reference voltage generator 110 and a plurality of receivers 120_1-120_N, wherein each of the receivers 120_1-120_N comprises a low-pass filter, a plurality of amplifying stages and a feedback circuit. For example, the receiver 120_1 comprises an amplify stage 122_1 serving as an input stage, an amplifying stage 124_1 serving as an output stage, a capacitor CFB_1 serving as the feedback circuit, and a low-pass filter 126_1 comprising a resistor R_1 and a capacitor C_1; and the receiver 120_N comprises an amplify stage 122_N serving as an input stage, an amplifying stage 124_N serving as an output stage, a capacitor CFB_N serving as the feedback circuit, and a low-pass filter 126_N comprising a resistor R_N and a capacitor C_N. In this embodiment, the circuit 100 is a front-end circuit within a chip such as a DRAM or any other memory device, and the receivers 120_1-120_N are connected to pads or pins 102_1-102_N of the chip, and the receivers 120_1-120_N are configured to receive input signals Vin_1-Vin_N from the pads or pins 102_1-102_N to generate output signals Vout_1-Vout_N, respectively.

In the embodiment shown in FIG. 1, the reference voltage generator 110 is configured to generate a reference voltage Vref to the receivers 120_1-120_N, and each of the amplifying stages 122_1-122_N are configured to receive the corresponding input signals Vin_1-Vin_N and the reference voltage Vref to generate a first signal (e.g. V1 within the receiver 120_1) and a second signal (e.g. V2 within the receiver 120_1), and each of the amplifying stages 122_1-122_N are configured to generate the corresponding output signals Vout_1-Vout_N according to the first signal and the second signal. Because of parasitic capacitance between two input terminals of each receiver 120_1-120_N, a level of the reference voltage Vref may be temporarily shifted due to the input signals Vin_1-Vin_N; and because all of the receivers 120_1-120_N are received the same reference voltage Vref from the reference voltage generator 110, the unstable reference voltage Vref may influence the operations of the receivers 120_1-120_N. For example, the receiver 120_1 has a first input terminal Nin1, a second input terminal Nin2, a first output terminal Nout1 and a second output terminal Nout2, and when the receiver 120_1 receives the input signal Vin_1 at the first input terminal Nin1, the input signal Vin_1 may be coupled to the second input terminal Nin2 via parasitic capacitance within the receiver 120_1, and the reference voltage Vref connected to the second input terminal Nin2 will not have a stable level due to this coupled input signal. To eliminate noise coupled to the reference voltage Vref, that is to eliminate the coupled input signal of the reference voltage Vref, the receiver 120_1 further has the capacitor CFB_1 coupled between the first output terminal Nout_1 and the second input terminal Nin2, and a feedback signal generated from the first signal V1 and capacitor CFB_1 and inputted to the second input terminal Nin2 can cancel the noise coupled to the reference voltage Vref.

In this embodiment, the first output terminal Nout1 serves as an inverting output terminal corresponding to the first input terminal Nin1, that is a phase of the first signal V1 can be regarded as being opposite to a phase of the input signal Vin_1. Therefore, because the noise of the reference voltage Vref and the input signal Vin_1 have the same phase, the feedback signal inputted generated from the first signal V1 and capacitor CFB_1 and inputted to the second input terminal Nin2 indeed eliminates the noise of the reference voltage Vref.

In addition, the receiver 120_1 further comprises the low-pass filter 126_1 for stabilizing the reference voltage Vref more. Because noise of the reference voltage Vref is eliminated or reduced by using the capacitor CFB_1, the low-pass filter 126_1 can be designed to have the capacitor C_1 with smaller size, to reduce chip area and save manufacturing cost.

In the embodiment shown in FIG. 1 each of the receivers 120_1-120_N has the capacitor CFB_1-CFB_N to eliminate the noise of the reference voltage Vref. In other embodiments of the present invention, only a portion of the receivers 120_1-120_N serve(s) as specific receiver(s) and is/are designed to have the feedback circuit such as the capacitor CFB_1, and the other of the receivers 120_1-120_N are designed to not have the feedback circuit such as the capacitor CFB_1. These alternative designs shall fall within the scope of the present invention.

In the embodiment shown in FIG. 1, the capacitor CFB_1 serves as the feedback circuit intentionally positioned between the first output terminal Nout1 and the second input terminal Nin2, but it's not a limitation of the present invention. In another embodiment, the feedback circuit may be implemented by a transistor, wherein a first electrode (e.g. drain electrode) of the transistor may be coupled to the first output terminal Nout1, a second electrode (e.g. source electrode) of the transistor may be coupled to the second input terminal Nin2, and a gate electrode of the transistor may be coupled to a bias voltage.

Figure 2:
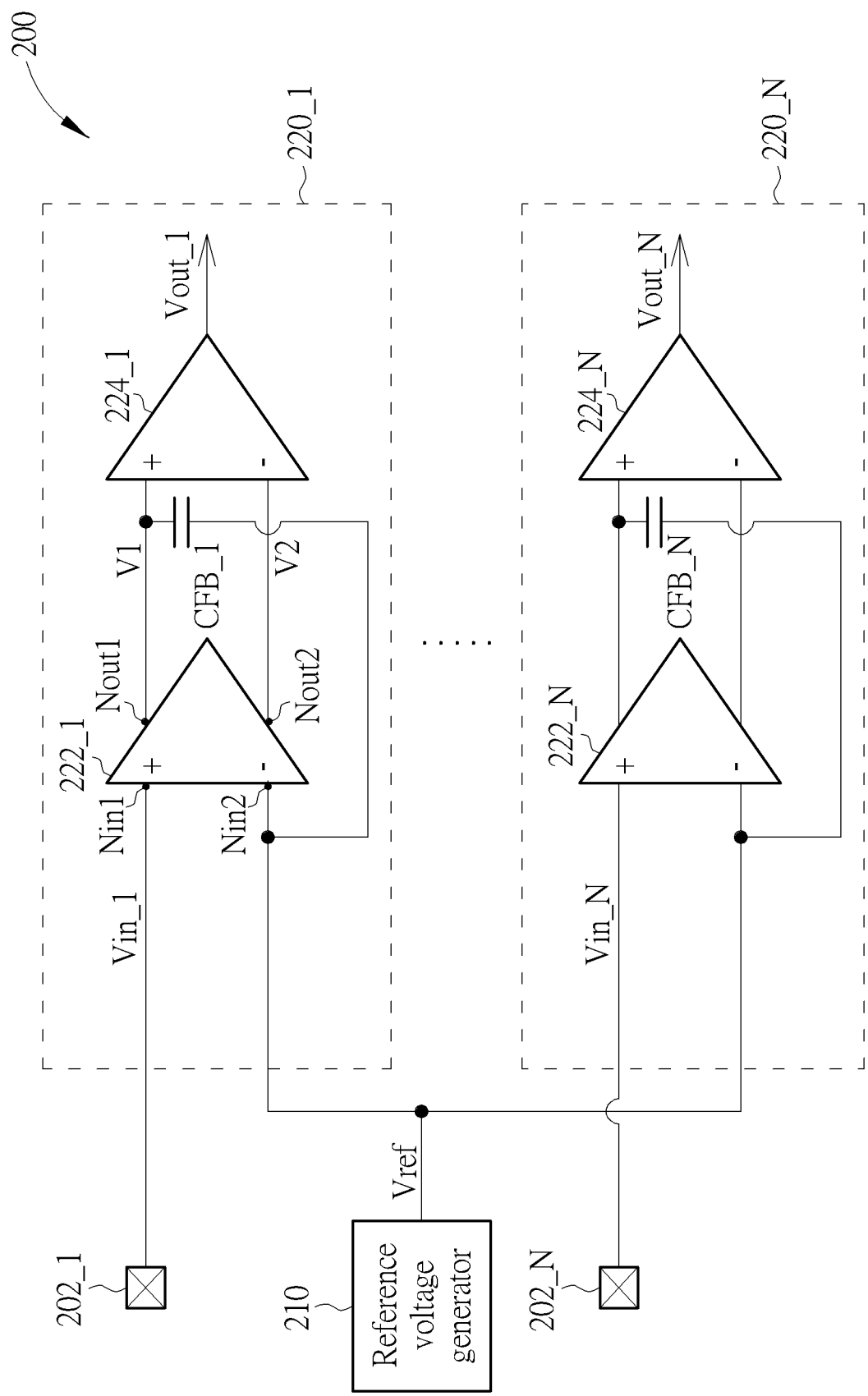
FIG. 2 is a diagram illustrating a circuit according to one embodiment of the present invention.

FIG. 2 is a diagram illustrating a circuit 200 according to another embodiment of the present invention. As shown in FIG. 2, the circuit 200 comprises a reference voltage generator 210 and a plurality of receivers 220_1-220_N, wherein each of the receivers 220_1-220_N comprises a plurality of amplifying stages and a feedback circuit. For example, the receiver 220_1 comprises an amplify stage 222_1 serving as an input stage, an amplifying stage 224_1 serving as an output stage, a capacitor CFB_1 serving as the feedback circuit; and the receiver 220_N comprises an amplify stage 222_N serving as an input stage, an amplifying stage 224_N serving as an output stage, a capacitor CFB_N serving as the feedback circuit. In this embodiment, the circuit 200 is a front-end circuit within a chip such as a DRAM or any other memory device, and the receivers 220_1-220_N are connected to pads or pins 202_1-202_N of the chip, and the receivers 220_1-220_N are configured to receive input signals Vin_1-Vin_N from the pads or pins 202_1-202_N to generate output signals Vout_1-Vout_N, respectively.

In the embodiment shown in FIG. 2, the reference voltage generator 210 is configured to generate a reference voltage Vref to the receivers 220_1-220_N, and each of the amplifying stages 222_1-222_N are configured to receive the corresponding input signals Vin_1-Vin_N and the reference voltage Vref to generate a first signal (e.g. V1 within the receiver 220_1) and a second signal (e.g. V2 within the receiver 220_1), and each of the amplifying stages 222_1-222_N are configured to generate the corresponding output signals Vout_1-Vout_N according to the first signal and the second signal. Because of parasitic capacitance between two input terminals of each receiver 120_1-120_N, a level of the reference voltage Vref may be temporarily shifted due to the input signals Vin_1-Vin_N; and because all of the receivers 120_1-120_N are received the same reference voltage Vref from the reference voltage generator 110, the unstable reference voltage Vref may influence the operations of the receivers 120_1-120_N. For example, the receiver 220_1 has a first input terminal Nin1, a second input terminal Nin2, a first output terminal Nout1 and a second output terminal Nout2, and when the receiver 220_1 receives the input signal Vin_1 at the first input terminal Nin1, the input signal Vin_1 may be coupled to the second input terminal Nin2 via parasitic capacitance within the receiver 220_1, and the reference voltage Vref connected to the second input terminal Nin2 will not have a stable level due to this coupled input signal. To eliminate noise coupled to the reference voltage Vref, that is to eliminate the coupled input signal of the reference voltage Vref, the receiver 220_1 further has the capacitor CFB_1 coupled between the first output terminal Nout_1 and the second input terminal Nin2, and a feedback signal generated from the first signal V1 and capacitor CFB_1 and inputted to the second input terminal Nin2 can cancel the noise coupled to the reference voltage Vref.

In this embodiment, the first output terminal Nout1 serves as an inverting output terminal corresponding to the first input terminal Nin1, that is a phase of the first signal V1 can be regarded as being opposite to a phase of the input signal Vin_1. Therefore, because the noise of the reference voltage Vref and the input signal Vin_1 have the same phase, the feedback signal inputted generated from the first signal V1 and capacitor CFB_1 and inputted to the second input terminal Nin2 indeed eliminates the noise of the reference voltage Vref.

In addition, because noise of the reference voltage Vref is eliminated or reduced by using the capacitor CFB_1, the circuit 200 does not need to have any other low-pass filter to stabilize the reference voltage Vref. For example, there is no low-pass filter positioned between the reference voltage generator 210 and the second input terminal Nin2 of the amplifying stage 222_1; or there is no capacitor intentionally positioned between the reference voltage Vref and a ground voltage, to reduce chip area and save manufacturing cost.

Figure 3:
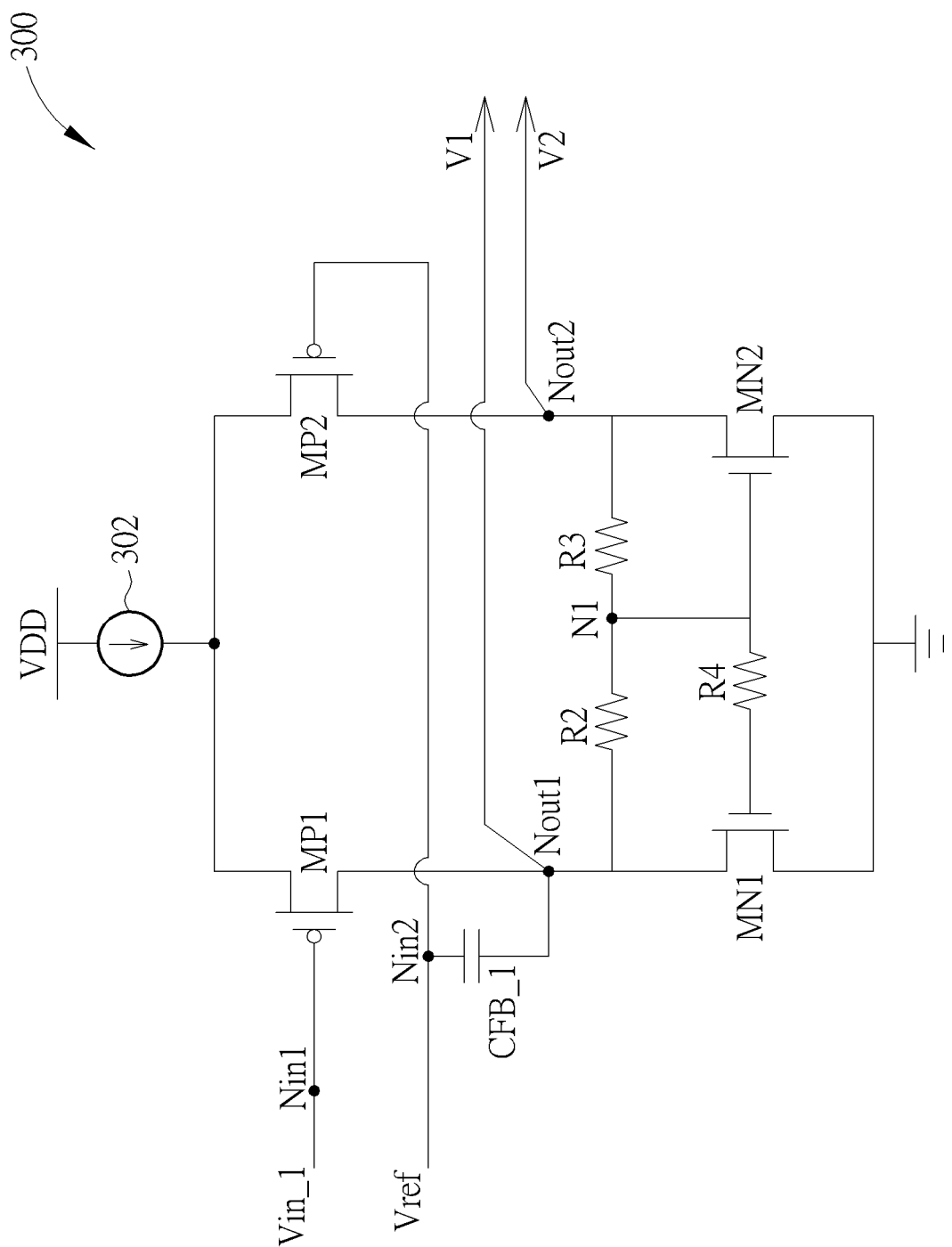
FIG. 3 is a diagram illustrating an amplifying stage according to one embodiment of the present invention

FIG. 3 is a diagram illustrating an amplifying stage 300 according to one embodiment of the present invention, wherein the amplifying stage 300 is an example of the amplifying stage 122_1/222_1 and the capacitor CFB_1. As shown in FIG. 3, the amplifying stage 300 comprises a current source 302, two P-type transistors MP1 and MP2, two N-type transistors MN1 and MN2, a capacitor CFB_1 serving as the first feedback circuit coupled between the first output terminal Nout1 and the second input terminal Nin2, and resistors R2, R3 and R4, wherein the resistor R2 is coupled between a node N1 and the first output terminal Nout1, the resistor R3 is coupled between the node N1 and the second output terminal Nout2, and the resistor R4 is coupled between the nodes N1 and N2. In FIG. 3, the current source 302 is coupled to a supply voltage VDD, a source electrode of the P-type transistor MP1 is coupled to the current source 302, a drain electrode of the P-type transistor MP1 is coupled to the first output terminal Nout1, and a gate electrode of the P-type transistor MP1 receives the input signal Vin_1; a source electrode of the P-type transistor MP2 is coupled to the current source 302, a drain electrode of the P-type transistor MP2 is coupled to the second output terminal Nout2, and a gate electrode of the P-type transistor MP2 receives the reference voltage Vref; a source electrode of the N-type transistor MN1 is coupled to a ground voltage, a drain electrode of the N-type transistor MN1 is coupled to the first output terminal Nout1; and a source electrode of the N-type transistor MN2 is coupled to the ground voltage, a drain electrode of the N-type transistor MN2 is coupled to the second output terminal Nout2, and a gate electrode of the N-type transistor MN1 is coupled to a gate electrode of the N-type transistor MN2. In this embodiment, the capacitor CFB_1 as mentioned in the embodiments of FIG. 1 and FIG. 2 is configured to generate a feedback signal to the second input terminal Nin2 to eliminate the noise of the reference voltage Vref and boost the bandwidth according to the first signal V1.

In another embodiment of the present invention, the amplifying stage 300 may further comprise a second feedback circuit coupled between an internal node and the first input terminal Nin1 to boot a bandwidth. For example, second feedback circuit may be positioned between the gate electrode of the N-type transistor MN1 and the first input terminal MN1, and the second feedback circuit is configured to generate another feedback signal to the first input terminal Nin1 to boost the bandwidth according to an internal signal at the gate electrode of the N-type transistor MN1, wherein the second feedback circuit may be a capacitor, and the internal signal Vint is generated according to the first signal V1.

Briefly summarized, in the circuit of present invention, by designing a feedback circuit to introduce a feedback signal to cancel noise of the reference voltage applied to a plurality of receivers, the reference voltage becomes stable and will not be influenced by the input signals. Therefore, the receivers can have better performance, and the circuit may only need to design low-pass filters with smaller area to stabilize the reference voltage, or the circuit may not need to design any filter for stabilizing the reference voltage, to reduce the chip area and manufacturing cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit, comprising:
    a reference voltage generator, configured to generate a reference voltage;
    a plurality of receivers, wherein each of the receivers is configured to receive the reference voltage and a corresponding input signal to generate a corresponding output signal;
    wherein for at least a specific receiver of the plurality of receivers, the specific receiver comprises at least one amplifying stage, the amplifying stage comprises a first input terminal configured to receive the corresponding input signal, a second input terminal configured to receive the reference voltage, a first output terminal configured to generate a first signal, and a second output terminal configured to generate a second signal; and the specific receiver further comprises a first feedback circuit coupled between the first output terminal and the second input terminal;
    wherein the first output terminal serves as an inverting output terminal corresponding to the first input terminal.

2. A circuit, comprising:
    a reference voltage generator, configured to generate a reference voltage;
    a plurality of receivers, wherein each of the receivers is configured to receive the reference voltage and a corresponding input signal to generate a corresponding output signal;
    wherein for at least a specific receiver of the plurality of receivers, the specific receiver comprises at least one amplifying stage, the amplifying stage comprises a first input terminal configured to receive the corresponding input signal, a second input terminal configured to receive the reference voltage, a first output terminal configured to generate a first signal, and a second output terminal configured to generate a second signal; and the specific receiver further comprises a first feedback circuit coupled between the first output terminal and the second input terminal;
    wherein the first input terminal receives the corresponding input signal, the corresponding input signal is coupled to the reference voltage at the second input terminal via parasitic capacitance to couple the corresponding input signal to the reference voltage, and a phase of the first signal is opposite to a phase of a first noise on the reference voltage due to the first signal; and the first feedback circuit provides a feedback signal generated by the first signal to eliminate the noise.

3. The circuit of claim 1, wherein the first feedback circuit comprises a capacitor, wherein a first electrode of the capacitor is coupled to the first output terminal, and a second electrode of the capacitor is coupled to the second input terminal.

4. The circuit of claim 1, wherein for a plurality of specific receiver of the plurality of receivers, each of the specific receivers comprises the at least one amplifying stage, the amplifying stage comprises the first input terminal configured to receive the corresponding input signal, the second input terminal configured to receive the reference voltage, the first output terminal configured to generate the first signal, and the second output terminal configured to generate the second signal; and each of the specific receivers further comprises the first feedback circuit coupled between the first output terminal and the second input terminal.

5. The circuit of claim 1, wherein each of the receivers comprises the at least one amplifying stage, the amplifying stage comprises the first input terminal configured to receive the corresponding input signal, the second input terminal configured to receive the reference voltage, the first output terminal configured to generate the first signal, and the second output terminal configured to generate the second signal; and each of the receivers further comprises the first feedback circuit coupled between the first output terminal and the second input terminal.

6. The circuit of claim 1, wherein the specific receiver further comprises a low-pass filter coupled between the reference voltage generator and the second input terminal of the amplifying stage.

7. The circuit of claim 1, wherein there is no low-pass filter positioned between the reference voltage generator and the second input terminal of the amplifying stage.

8. The circuit of claim 1, wherein there is no capacitor intentionally positioned between the reference voltage and a ground voltage.

9. The circuit of claim 1, wherein the circuit is within a memory device, and the plurality of receivers are configured to receive the corresponding input signals from pads or pins of the memory device.

* * * * *